US010091752B2

(12) United States Patent
Yang (10) Patent No.: US 10,091,752 B2
(45) Date of Patent: Oct. 2, 2018

(54) DEVICE AND METHOD FOR HANDLING CARRIER FREQUENCY OFFSET

(71) Applicant: MStar Semiconductor, Inc., Hsinchu Hsien (TW)

(72) Inventor: Fang-Ming Yang, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 107 days.

(21) Appl. No.: 15/244,272

(22) Filed: Aug. 23, 2016

(65) Prior Publication Data

US 2017/0325186 A1  Nov. 9, 2017

(30) Foreign Application Priority Data

May 9, 2016 (TW) .............................. 105114259 A (51) Int. Cl.
*H04W 56/00* (2009.01)
*H04L 7/00* (2006.01)
*H03L 7/00* (2006.01)

(52) U.S. Cl.
CPC ............. *H04W 56/004* (2013.01); *H03L 7/00* (2013.01); *H04L 7/0016* (2013.01)

(58) Field of Classification Search
None
See application file for complete search history.

(56) References Cited

U.S. PATENT DOCUMENTS

| 5,812,611 A * | 9/1998 | Sogabe ..................... H03J 7/04 327/47 |
| 2002/0126618 A1* | 9/2002 | Kim .................... H04L 27/2657 370/208 |
| 2003/0058787 A1* | 3/2003 | Vandenameele-Lepla ................. H04L 25/0202 370/206 |
| 2004/0170238 A1* | 9/2004 | Matsuyama ........ H04L 27/2657 375/343 |
| 2004/0179625 A1* | 9/2004 | Kim .................... H04L 27/2659 375/260 |

(Continued)

FOREIGN PATENT DOCUMENTS

| TW | 200937921 A | 9/2009 |
| TW | 200943859 A | 10/2009 |
| TW | 201306625 A | 2/2013 |

*Primary Examiner* — Candal Elpenord
(74) *Attorney, Agent, or Firm* — Edell, Shapiro & Finnan, LLC (57) ABSTRACT

A communication device includes: a computing circuit, performing a $J^{th}$ power operation according to a first plurality of time-domain signals to generate a first plurality of computed signals; a transforming circuit, coupled to the computing circuit, transforming the first plurality of computed signals to a first plurality of frequency-domain signals according to a time-frequency transformation; a control circuit, coupled to the converting circuit, performing an absolute value operation on the first plurality of frequency-domain signals to generate a first plurality of output signals; a selecting circuit, coupled to the control circuit, selecting a maximum output signal satisfying a check condition from the first plurality of output signals; and a frequency estimating circuit, coupled to the selecting circuit, estimating a carrier frequency offset according to the maximum output signal.

16 Claims, 4 Drawing Sheets

(56) References Cited

U.S. PATENT DOCUMENTS

| | | | | |
|---|---|---|---|---|
| 2006/0098749 A1* | 5/2006 | Sung | ................... | H04L 27/2655 |
| | | | | 375/260 |
| 2008/0310525 A1* | 12/2008 | Lin | ..................... | H04J 11/0069 |
| | | | | 375/260 |
| 2011/0268169 A1* | 11/2011 | Mitsugi | ............... | H04L 25/0212 |
| | | | | 375/226 |
| 2012/0321021 A1* | 12/2012 | Matsunnura | ........ | H04L 27/2607 |
| | | | | 375/340 |
| 2013/0170590 A1* | 7/2013 | Hyll | ................... | H04L 27/0014 |
| | | | | 375/343 |
| 2015/0341138 A1* | 11/2015 | Ishihara | ........... | H04B 10/25133 |
| | | | | 398/35 |

* cited by examiner

DEVICE AND METHOD FOR HANDLING CARRIER FREQUENCY OFFSET

This application claims the benefit of Taiwan application Serial No. 105114259, filed May 9, 2016, the subject matter of which is incorporated herein by reference.

BACKGROUND OF THE INVENTION

Field of the Invention

The invention relates in general to a device and method for a communication system, and more particularly to a device and method for handling carrier frequency offset.

Description of the Related Art

Due to the oscillator mismatch or the Doppler effect generated by relative movements between a transmitter and a receiver, operations of a communication system are frequently affected by carrier frequency offset (CFO). Carrier frequency offset often causes phase distortion of received signals, in a way that the receiver fails to correctly recover transmitted signals. In general, the receiver estimates the carrier frequency offset to compensate the phase distortion of received signals. However, in the lack of information of transmitted signals, the receiver is liable to process an excessive amount of signals before a reliable carrier frequency offset can be obtained, hence incurring unnecessary power consumption.

Therefore, there is a solution for obtaining a reliable carrier frequency offset while saving power consumption and reducing locking time.

SUMMARY OF THE INVENTION

The invention is directed to a device and method for handling carrier frequency offset. The device and method are capable of obtaining a reliable carrier frequency offset while saving power consumption and reducing locking time to eliminate the above issues.

The present invention discloses a communication device. The communication device includes: a receiving circuit, receiving a first plurality of time-domain signals; a computing circuit, coupled to the receiving circuit, performing a $J^{th}$ power operation according to the first plurality of time-domain signals to generate a first plurality of computed signals; a transforming circuit, coupled to the computing circuit, transforming the first plurality of computed signals to a first plurality of frequency-domain signals according to a time-frequency transformation; a control circuit, coupled to the transforming circuit, performing an absolute value operation on the first plurality of frequency-domain signals to generate a first plurality of output signals; a selecting circuit, coupled to the control circuit, selecting a maximum output signal satisfying a check condition from the first plurality of output signals; and a frequency estimating circuit, coupled to the selecting circuit, estimating a carrier frequency offset according to the maximum output signal.

The present invention further discloses a method for handling carrier frequency offset. The method includes: receiving a first plurality of time-domain signals by a receiving circuit; performing a $J^{th}$ power operation according to the first plurality of time-domain signals to generate a first plurality of computed signals by a computing circuit; transforming the first plurality of computed signals to a first plurality of frequency-domain signals according to a time-frequency transformation by a transforming circuit; performing an absolute value operation on the first plurality of frequency-domain signals to generate a first plurality of output signals by a control circuit; selecting a maximum output signal satisfying a check condition from the first plurality of output signals by a selecting circuit; and estimating a carrier frequency offset according to the maximum output signal by a frequency estimating circuit.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
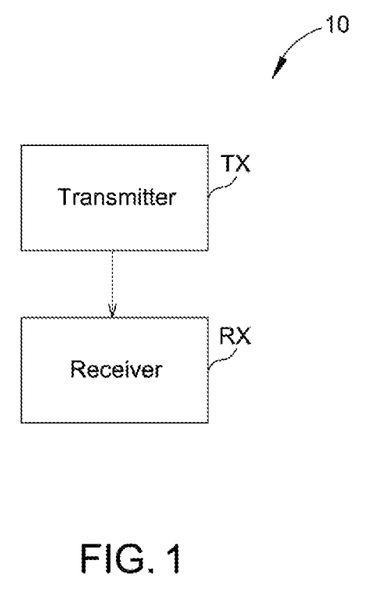
FIG. 1 is a schematic diagram of a communication system according to an embodiment of the present invention.

FIG. 1 shows a schematic diagram of a communication device 10 according to an embodiment of the present invention. For example, the communication system 10 is any communication system capable of transmitting and/or receiving single-carrier signals or multi-carrier signals, and is primarily formed by a transmitter TX and a receiver RX. For example, the multi-carrier signal may be an orthogonal frequency-division multiplexing (OFDM) signal (or referred to as a discrete multi-tone modulation (DMT) signal). In FIG. 1, the transmitter TX and the receiver RX are for illustrating the architecture of the communication system 10. For example, the communication system 10 may be wired communication system such as an asymmetric digital subscriber line (ADSL) system, a power line communication (PLC) system or an Ethernet over coax (EOC) system, or a wireless communication system such as a wireless local area network (WLAN), a Digital Video Broadcasting (DVB) system or a Long Term Evolution-Advanced (LTE-A) system. The DVB system may include a Digital Terrestrial Multimedia Broadcast (DTMB) system, a DVB-Terrestrial (DVT-T) system, a DVB Second Generation Terrestrial/Cable (DVB-T2/C2) system and an Integrated Services Digital Broadcasting (ISDB) system. Further, for example but not limited to, the transmitter TX and the receiver RX may be disposed in a mobile phone, a laptop computer, a tablet computer, an e-book or a portable computer system.

Figure 2:
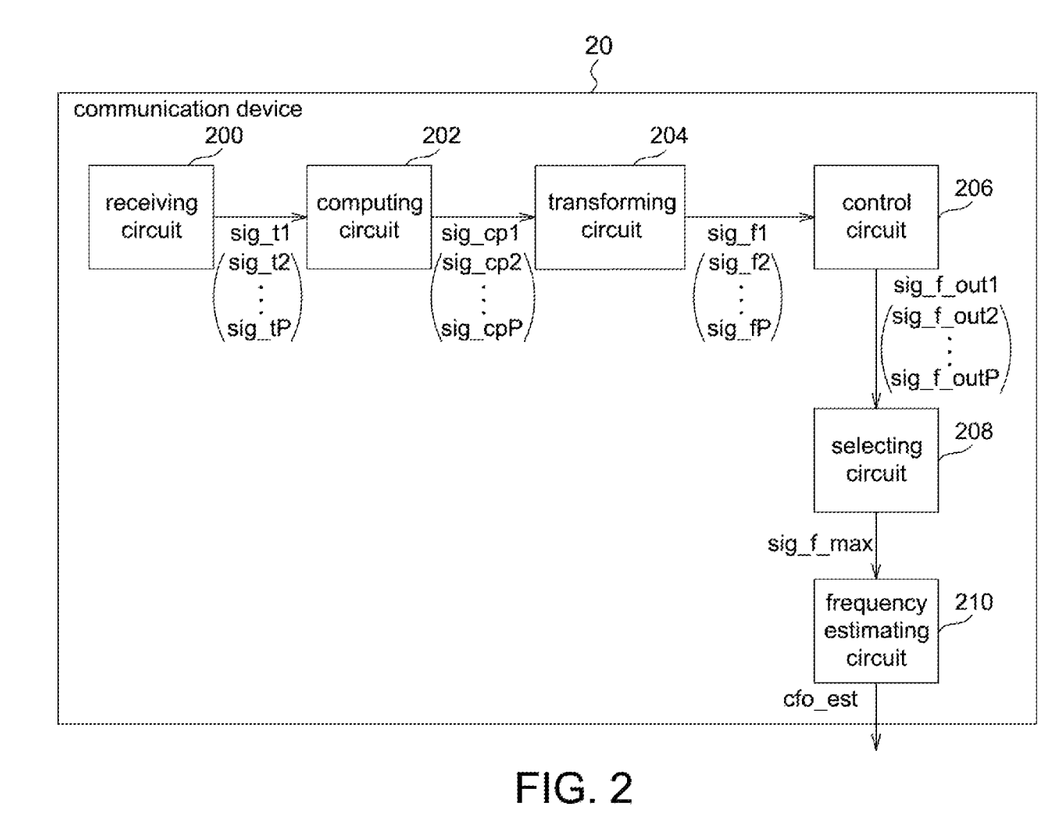
FIG. 2 is a schematic diagram of a communication system according to an embodiment of the present invention.

FIG. 2 shows a schematic diagram of a communication device 20 according to an embodiment of the present invention. The communication device 20 is applicable in the receiver RX in FIG. 1, and is used for estimating carrier frequency offset (CFO). The communication device 20 includes a receiving circuit 200, a computing circuit 202, a transforming circuit 204, a control circuit 206, a selecting circuit 208 and a frequency estimating circuit 210. More specifically, after receiving a plurality of time-domain signals sig_t1, the receiving circuit 200 provides the plurality of time-domain signals sig_t1 to the computing circuit 202. For example but not limited to, the plurality of time-domain signals sig_t1 may be signals generated by modulation operations such as quadrature amplitude modulation (QAM), 32QAM, 64QAM, 128QAM or 256QAM. The computing circuit 202, coupled to the receiving circuit 200, performs a $J^{th}$ power operation according to the plurality of time-domain signals sig_t1 to generate a plurality of computed signals sig_cp1. For example but not limited to, the $J^{th}$ power operation may be a $4^{th}$ power operation. Further, the computing circuit 202 may perform the $J^{th}$ power operation on the plurality of time-domain signals sig_t1 that the receiving circuit 200 provides all at the same time, or sequentially and individually perform the $J^{th}$ power operation on the plurality of time-domain signals sig_t1, and then provide the plurality of computed signals sig_cp1 altogether. The transforming circuit 204, coupled to the computing circuit 202, transforms the plurality of time-domain signals sig_t1 to a plurality of frequency-domain signals sig_f1 according to a time-frequency transformation. For example but not limited to, the time-frequency transformation may be an algorithm capable of transforming time-domain signals to frequency-domain signals, such as a fast Fourier transform.

The control circuit 206, coupled to the transforming circuit 204, performs an absolute value operation (for obtaining respective absolute values of the plurality of frequency-domain signals sig_f1) on the plurality of frequency-domain signals sig_f1 to generate a plurality of output signals sig_f_out1. The selecting circuit 208, coupled to the control circuit 206, selects a maximum output signal sig_f_max satisfying a check condition from the plurality of output signals sig_f_out1. The maximum output signal sig_f_max has a maximum amplitude that satisfies the check condition, i.e., the amplitude of the maximum output signal sig_f_max not only is greater than the amplitude of all other output signals of the plurality of output signals sig_f_out1 but also satisfies the check condition. According to the above description, during the process that the selecting circuit 208 searches for the maximum signal, it considers the amplitude of a signal as well as whether the signal satisfies the check condition, so as to increase the reliability of the selected signal. The frequency estimating circuit 210, coupled to the selecting circuit 208, estimates a carrier frequency offset cfo_est according to the maximum output signal sig_f_max. As the selected maximum output signal sig_f_max has a higher reliability, the accuracy of the carrier frequency offset cfo_est may be increased to further increase the probability of the communication device 20 recovering the transmitted signals.

In one embodiment, the plurality of output signals sig_f_out1 may not include the maximum output signal sig_f_max that satisfies the check condition. That is, according to the check condition, none of the plurality of output signals sig_f_out1 has sufficient reliability. In the above situation, the communication device 20 may further receive other time-domain signals to improve the reliability of the output signals. More specifically, the receiving circuit 200 may further include a plurality of time-domain signals sig_t2. Similarly, the computing circuit 202 performs a $J^{th}$ power operation on the plurality of time-domain signals sig_t2 to generate a plurality of computed signals sig_cp2. The transforming circuit 204 transforms the plurality of computed signals sig_cp2 to a plurality of frequency-domain signals sig_f2 according to a time-frequency transformation. The control circuit 206 performs an absolute value operation (for obtaining respective absolute values of the plurality of frequency-domain signals sig_f2) on the plurality of frequency-domain signals sig_f2 to generate a plurality of output signals sig_f_out2. The selecting circuit 208 correspondingly adds the plurality of output signals sig_out1 and the plurality of output signals sig_f_out2 to generate a plurality of auxiliary signals, and selects the maximum output signal sig_f_max satisfying the check condition from the plurality of auxiliary signals. Operation details of the frequency estimating circuit 210 are identical to those in the foregoing description, and shall be omitted herein. That is to say, the communication device is capable of reducing negative effects (e.g., noise and/or interference) through adding the received frequency-domain signals to improve the reliability of output signals to further select the maximum output signal sig_f_max that satisfies the check condition.

If the selecting circuit 208 still fails to select the maximum output signal sig_f_max satisfying the check condition, the receiving circuit 200 may continue receiving a plurality of time-domain signals sig_t3 to sig_tP. Correspondingly, the computing circuit 202 generates a plurality of computed signals sig_cp3 to cpP, the transforming circuit 204 generates a plurality of frequency-domain signals sig_f3 to sig_fP, the control circuit 206 generates a plurality of output signals sig_f_out2 to sig_f_outP, and the selecting circuit 208 adds the plurality of output signals sig_f_out3 to sig_f_outP received, until the selecting 208 successfully selects the maximum output signal sig_f_max satisfying the check condition from the plurality of auxiliary signals. Thus, the present invention provides a communication device that stops processing (e.g., receiving) additional time-domain signals according to whether a (maximum) output signal satisfies a check condition, while reducing unnecessary power consumption and locking time as well as solving the issue of a conventional communication device that processes excessive and redundant time-domain signals.

There are numerous ways for the selecting circuit 208 to select the maximum output signal. For example, according to a sliding window method, the selecting circuit 208 may sequentially select a plurality of maximum output signals satisfying the check condition from a plurality of sets of output signals of a plurality of output signals sig_f_out1 (or a plurality of auxiliary signals obtained after the addition) using a window, and select the maximum output signal sig_f_max from the plurality of maximum output signals. Further, there are numerous ways for determining the check condition for the reliability of signals. For example, one set of output signals from a plurality of sets of output signals may satisfy the check condition according to an equation below:

$$f(\{Z_k\}_{k=1,k\neq sub\_max}^{M})+Z_{sub\_max}<G*Z_{sub\_max} \quad (1)$$

In the above equation, $\{Z_k\}_{k=1}^{M}$ is the set of output signals, M is the size of the window, f(•) is a function, sub_max is an index of a maximum output signal of the set of output signals, and G is a positive real number. That is to say, $G*Z_{sub\_max}$ needs to be large enough in order to be determined as satisfying the check condition. G is a design value or a predetermined value, and may be determined based on system considerations and design requirements. For example, for a higher reliability requirement, G may be set to a smaller real number, i.e., the maximum output signal $Z_{sub\_max}$ is less easily satisfied (equation (1)). Conversely, for a lower reliability requirement, G may be set to a larger real number, i.e., the maximum output signal $Z_{sub\_max}$ is more easily satisfied (equation (1)). Further, the above function may be an equation below:

$$f(\{Z_k\}_{k=1,k\neq sub\_max}^{M})=\Sigma_{k=1,k\neq sub\_max}^{M} Z_k \quad (2)$$

That is, equation (1) means that $G*Z_{sub\_max}$ needs to be greater than the sum of all $\{Z_k\}_{k=1}^{M}$ in order to be determined as satisfying the check condition. It should be noted that, equation (1) and equation (2) illustrate only one method for selecting a maximum output signal in one set of output signals. The selecting circuit 208 needs to iterate equation (1) and equation (2) for all sets of output signals in the plurality of output signals sig_f_out1 (or the plurality of auxiliary signals obtained after the addition) according to the sliding window method to select the maximum output signal sig_f_max.

It should be noted that, the check condition may also be associated with the computation capability of the communication device 20. For example, the addition of the output signal may be terminated when a predetermined computation time is reached, and the maximum output signal sig_f_max obtained is outputted.

Figure 3:
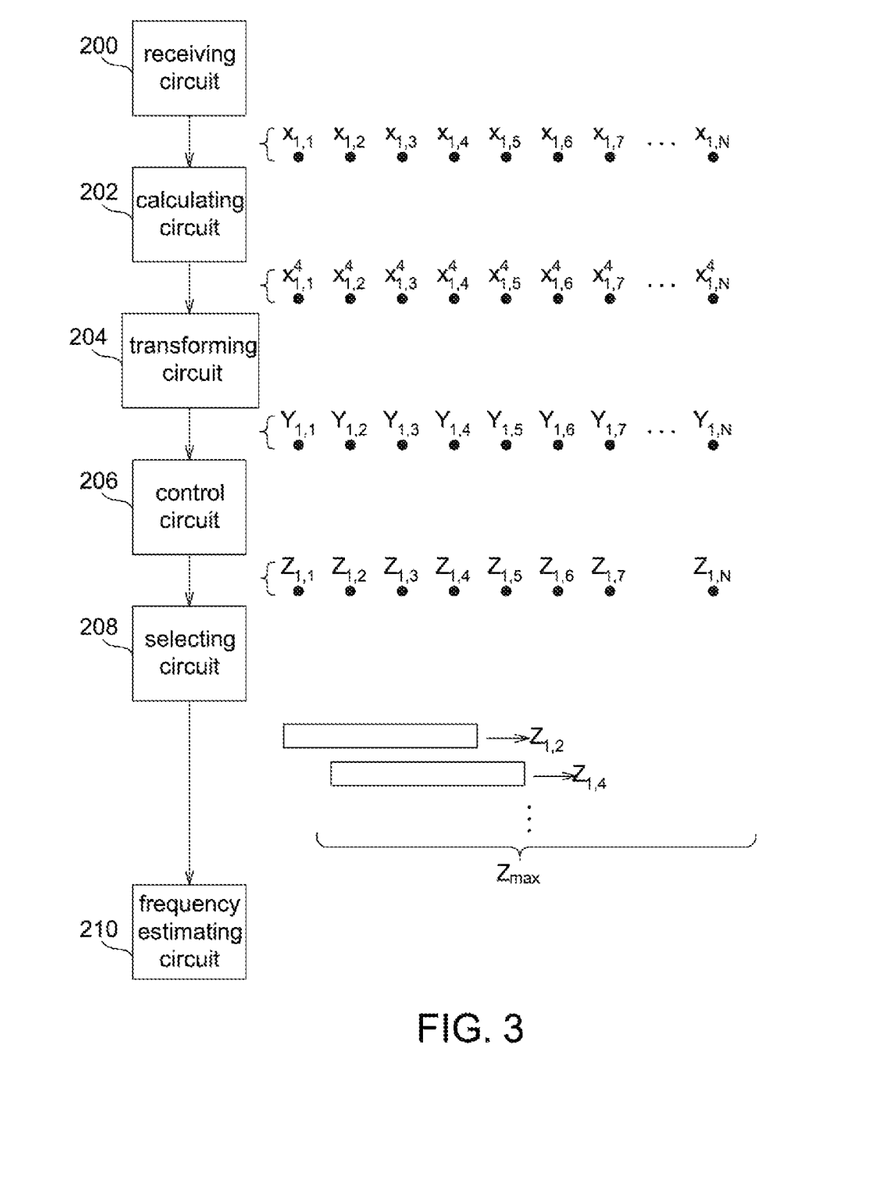
FIG. 3 is a schematic diagram illustrating operations of estimating carrier frequency offset according to an embodiment of the present invention.

FIG. 3 shows a schematic diagram illustrating operations of estimating carrier frequency offset according to an embodiment of the present invention, as an example for explaining the operations of the communication device 20. In FIG. 3, the receiving circuit 200 receives a plurality of time-domain signals sig_t1 ($x_{1,1}, \ldots, x_{1,N}$) for the computing circuit 202 to perform a $4^{th}$ power operation to generate a plurality of computed signals sig_cp1 ($x_1^4, \ldots, x_{1,N}^4$), where N is the size of FFT. The transforming circuit 204 transforms the plurality of computed signals ($x_{1,1}^4, \ldots, x_{1,N}^4$) to a plurality of frequency-domain signals sig_f1 ($Y_{1,1}, \ldots, Y_{1,N}$) according to a time-frequency transformation. The control circuit 206 performs an absolute value operation on the plurality of frequency-domain signals sig_f1 ($Y_{1,1}, \ldots, Y_{1,N}$) to generate a plurality of output signals sig_f_out1 ($Z_{1,1}, \ldots, Z_{1,N}$), i.e., $Z_{1,k}=|Y_{1,k}|$, k=1, ..., N. According to the sliding window method, the selecting circuit 208 sequentially selects a plurality of maximum output signals sig_f_max satisfying the check condition from a plurality of sets of output signals of the plurality of output signals sig_f_out ($Z_{1,1}, \ldots, Z_{1,N}$) using a window. To better describe the embodiment to get better understanding of the concept of the present invention, it is assumed that the check condition in this embodiment is equation (1) and equation (2).

For example, the size of the window that the selecting circuit 208 uses is 4 (i.e., M in equation (1) is 4), and a maximum output signal is first selected from the output signals $Z_{1,1}, \ldots, Z_{1,4}$, e.g. the maximum output signal is $Z_{1,2}$. The selecting circuit 208 then checks whether $Z_{1,2}$ satisfies $\Sigma_{k=1,k\neq 4}Z_{1,k}+Z_{1,2}<G*Z_{1,2}$. As previously stated, G is a positive real number and may be determined based on system considerations and design requirements. If the output signal $Z_{1,2}$ satisfies the check condition, the selecting circuit 208 regards the output signal $Z_{1,2}$ as a valid maximum output signal for estimating the carrier frequency offset, and stores the output signal $Z_{1,2}$ in the communication device 20. According to the window sliding method, the selecting circuit 208 continues selecting a maximum output signal from the output signals $Z_{1,2}, \ldots, Z_{1,5}$, e.g., the maximum output signal is $Z_{1,4}$, and compares the selected maximum output signal with the previous temporarily stored maximum value $Z_{1,2}$. Next, the selecting circuit 208 checks whether $Z_{1,4}$ satisfies a condition $Z_{1,4}>Z_{1,2}$. If this condition is satisfied, the temporarily stored maximum output signal is updated to $Z_{1,4}$. It is continued to check whether $\Sigma_{k=2,k\neq 4}^{5}Z_{1,k}+Z_{1,4}<G*Z_{1,4}$. If the maximum output signal $Z_{1,4}$ satisfies the check condition, the carrier frequency offset estimated according to this maximum value is determined as valid; if the maximum output signal $Z_{1,4}$ does not satisfy the check condition, the carrier frequency offset estimated according to this maximum value is determined as invalid. If $Z_{1,4}$ does not satisfy $Z_{1,4}>Z_{1,2}$, $Z_{1,2}$ is kept as the maximum output signal temporarily stored, and the valid or invalid status of the carrier frequency offset determined according to $Z_{1,2}$ is kept. The selecting circuit 208 continues the above operations until all of the output signals $Z_{1,N-4}, \ldots, Z_{1,N}$ are completely processed.

After the above operations are performed, if the maximum output signal satisfies the check condition, the carrier frequency offset estimated according to this maximum output signal is determined as valid. For example, for the output signal $Z_{max}$, the frequency estimating circuit 210 may estimate the carrier frequency offset cfo_est according to the output signal $Z_{max}$. Conversely, if the maximum output signal satisfying the condition is non-existent, the receiving circuit 200 additionally receives a plurality of time-domain signals sig_t2 ($x_{2,1}, \ldots, x_{2,N}$) for the computing circuit 202 to perform a $4^{th}$ power operation to generate a plurality of computed signals sig_cp2 ($x_{2,1}^4, \ldots, x_{2,N}^4$), where N is the size of FFT. The computing circuit 20 performs a $4^{th}$ power operation according to the plurality of time-domain signals sig_t2 ($x_{2,1}, \ldots, x_{2,N}$) to generate a plurality of computed signals sig_cp2 ($x_{2,1}^4, \ldots, x_{2,N}^4$). Next, the transforming circuit 204 transforms the plurality of computed signals sig_cp2 ($x_{2,1}^4, \ldots, x_{2,N}^4$) to a plurality of frequency-domain signals sig_f2 ($Y_{2,1}, \ldots, Y_{2,N}$) according to a time-frequency transformation. The control circuit 206 performs an absolute value operation on the plurality of frequency-domain signals sig_f2 ($Y_{2,1}, \ldots, Y_{2,N}$) to generate a plurality of output signals sig_f_out2 ($Z_{2,1}, \ldots, Z_{2,N}$), i.e., $Z_{2,k}=|Y_{2,k}|$, k=1, ..., N. The selecting circuit 208 correspondingly adds the plurality of output signals sig_f_out1 ($Z_{1,1}, \ldots, Z_{1,A}$) and the plurality of output signals sig_f_out2 ($Z_{2,1}, \ldots, Z_{2,N}$) to generate a plurality of auxiliary signals ($A_1, \ldots, A_N$), i.e., $A_k=\Sigma_{n=1}^{2}Z_{n,k}$. According to the sliding window method, the selecting circuit 208 sequentially selects the maximum output signal sig_f_max from a plurality of sets of output signals of the plurality of auxiliary signals ($A_1, \ldots, A_N$) using a window, and determines whether the selected maximum output signal sig_f_max satisfies the check condition. Details of the sliding window method may be referred from the foregoing description, and shall be omitted herein.

Similarly, after the above operations are performed, if the maximum output signal satisfying the check condition exists, e.g., the output signal $Z_{max}$, the frequency estimating circuit 210 may estimate the carrier frequency offset cfo_est according to the the output signal $Z_{max}$. Conversely, if the maximum output signal satisfying the check condition is non-existent, the receiving circuit 200 continues receiving a plurality of time-domain signals sig_t3 ($x_{3,1}, \ldots, x_{3,N}$) to a plurality of time-domain signals sig_tP ($x_{P,1}, \ldots, x_{P,N}$), the computing circuit 202 generates a plurality of computed signals sig_cp3 ($x_{3,1}^4, \ldots, x_{3,N}^4$) to a plurality of computed signals sig_cpP ($x_{P,1}^4, \ldots, x_{P,N}^4$), the transforming circuit 204 generates a plurality of frequency-domain signals sig_f3 ($Y_{3,1}, \ldots, Y_{3,N}$) to a plurality of frequency-domain signals sig_fP ($Y_{P,1}, \ldots, Y_{P,N}$), the control circuit 206 generates a plurality of output signals sig_f_out3 ($Z_{3,1}, \ldots, Z_{3,N}$) to a plurality of output signals sig_f_outP ($Z_{P,1}, \ldots, Z_{P,N}$), and the selecting circuit 208 generates a plurality of auxiliary signals ($A_1, \ldots, A_N$), where $A_k=\Sigma_{n=1}^{P}Z_{n,k}$. The above operations are continued until the selecting circuit 208 successfully selects the maximum output signal sig_f_max satisfying the check condition from the plurality of auxiliary signals ($A_1, \ldots, A_N$).

Figure 4:
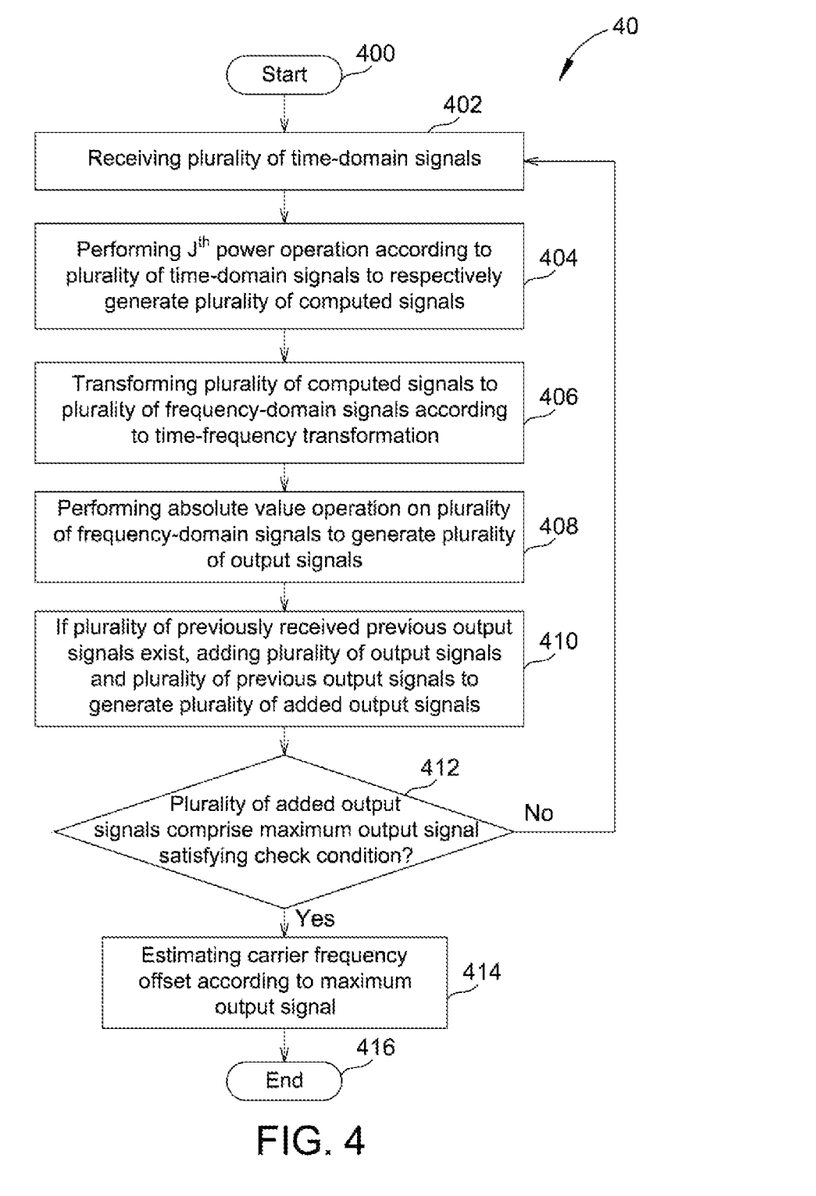
FIG. 4 is a flowchart of a process according to an embodiment of the present invention.

According to the above description, an example of a maximum output signal and an estimated carrier frequency offset is as below. When the size of FFT is N and the operating frequency of the frequency estimating circuit 210 is $F_S$ MHz, if the index of the maximum output signal is A, the estimated carrier frequency offset may be represented as $(A-N/2)(F_S/4N)$ MHz. For example, if N=2048 and J=4, the carrier frequency offset may be obtained according to indices A of different maximum output signals as below:

(1) A=1024, the carrier frequency offset=0 MHz;
(2) A=1030, the carrier frequency offset=$6(F_S/4N)$ MHz;
(3) A=1020, the carrier frequency offset=$(-4)(F_S/4N)$ MHz The foregoing operations of the communication device 20 may be concluded into a process 40 suitable for the receiver RX, as shown in FIG. 4. The process 40 includes following steps.

In step 400, the process 40 begins.

In step 402, a plurality of time-domain signals are received.

In step 404, a $J^{th}$ power operation is performed according to a plurality of added time-domain signals to generate a plurality of computed signals.

In step 406, the plurality of computed signals are transformed to a plurality of frequency-domain signals according to a time-frequency transformation.

In step 408, an absolute value operation is performed on the plurality of frequency-domain signals to generate a plurality of output signals.

In step 410, if a plurality of previous outputted signals previously received are present, the plurality of output signals and the plurality of previous output signals are added to generate a plurality of added output signals.

In step 412, it is determined whether the plurality of added output signals include a maximum output signal satisfying a check condition. Step 414 is performed if so, or step 402 is performed if not.

In step 414, a carrier frequency offset is estimated according to the maximum output signal.

In step 416, the process 40 ends.

The process 40 is an example for explaining the operations of the communication device 20. Associated details and variations may be referred from the foregoing description, and shall be omitted herein.

It should be noted that, there are numerous ways to implement the communication device 20 (and the receiving circuit 200, the computing circuit 202, the transforming circuit 204, the control circuit 206, the selecting circuit 208 and the frequency estimating circuit 210 therein). For example, based on design considerations or system requirements, the receiving circuit 200, the computing circuit 202, the transforming circuit 204, the control circuit 206, the selecting circuit 208 and the frequency estimating circuit 210 may be integrated into one or multiple circuits, and are usually realized by digital circuits. In some embodiments, the receiving circuit 200 may include an analog-to-digital converter. Further, for example, the communication device 20 may be a combination of hardware, software and firmware (a combination of a hardware device, a computer instruction and data, with the computer instruction and data being read-only software on the hardware device), an electronic system, or a combination of the above devices.

In conclusion, the present invention provides a device and method for handling carrier frequency offset. The device and method are capable of stopping processing additional time-domain signals according to whether a (maximum) output signal satisfies a check condition, while reducing unnecessary power consumption and locking time as well as solving the issue of a conventional communication device that processes excessive and redundant time-domain signals.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A communication device, comprising:
    a receiving circuit, receiving a first plurality of time-domain signals;
    a computing circuit, coupled to the receiving circuit, performing a $J^{th}$ power operation according to the first plurality of time-domain signals to respectively generate a first plurality of computed signals;
    a transforming circuit, coupled to the computing circuit, transforming the first plurality of computed signals to a first plurality of frequency-domain signals according to a time-frequency transformation;
    a control circuit, coupled to the transforming circuit, performing an absolute value operation on the first plurality of frequency-domain signals to generate a first plurality of output signals;
    a selecting circuit, coupled to the control circuit, selecting a maximum output signal satisfying a check condition from the first plurality of output signals; and
    a frequency estimating circuit, coupled to the selecting circuit, estimating a carrier frequency offset according to the maximum output signal to obtain an estimated carrier frequency offset,
    wherein the communication device is configured to apply the estimated carrier frequency offset to compensate for phase distortion of the plurality of time-domain signals.

2. The communication device according to claim 1, wherein when the first plurality of output signals do not include the maximum output signal satisfying the check condition, the communication performs operations of:
    the receiving circuit receiving a second plurality of time-domain signals;
    the computing circuit performing the $J_{th}$ power operation according to the second plurality of time-domain signals to a second plurality of computed signals;
    the transforming circuit transforming the second plurality of computed signals to a second plurality of frequency-domain signals according to the time-frequency transformation;
    the control circuit performing the absolute value operation on the second plurality of frequency-domain signals to generate a second plurality of output signals; and
    the selecting circuit correspondingly adding the first plurality of output signals and the second plurality of output signals to generate a plurality of auxiliary signals, selecting the maximum output signal from the plurality of auxiliary signals, and determining whether the maximum output signal satisfies the check condition.

3. The communication device according to claim 1, wherein the selecting circuit sequentially selects the maximum output signal from a plurality of sets of output signals of the first plurality of output signals using a window according to a sliding window method, and checks whether the maximum output signal satisfies the check condition.

4. The communication device according to claim 3, wherein one set of output signals of the plurality of sets of output signals satisfies the check condition according to an equation:

$$f(\{Z_k\}_{k=1, k \neq sub\_max}^{M}) + Z_{sub\_max} < G * Z_{sub\_max};$$

where $\{Z_k\}_{k=1}^{M}$ is the set of output signals, M is a size of the window, f(•) is a function, sub_max is an index of a maximum output signal of the set of output signals, and G is a positive real number.

5. The communication device according to claim 4, wherein the function is an equation:

$$f(\{Z_k\}_{k=1, k \neq sub\_max}^{M}) = \Sigma_{k=1, k \neq sub\_max}^{M} Z_k.$$

6. The communication device according to claim 1, wherein the time-frequency transformation comprises a fast Fourier transform (FFT).

7. The communication device according to claim 1, wherein the $J^{th}$ power operation is a $4^{th}$ power operation.

8. The communication device according to claim 1, wherein the maximum output signal has a maximum amplitude satisfying the check condition.

9. A method for handling carrier frequency offset, comprising:
receiving a first plurality of time-domain signals by a receiving circuit;
performing a $J^{th}$ power operation according to the first plurality of time-domain signals to respectively generate a first plurality of computed signals by a computing circuit;
transforming the first plurality of computed signals to a first plurality of frequency-domain signals according to a time-frequency transformation by a transforming circuit;
performing an absolute value operation on the first plurality of frequency-domain signals to generate a first plurality of output signals by a control circuit;
selecting a maximum output signal satisfying a check condition from the first plurality of output signals by a selecting circuit;
estimating a carrier frequency offset according to the maximum output signal by a frequency estimating circuit to obtain an estimated carrier frequency offset; and
applying the estimated carrier frequency offset to compensate for phase distortion of the plurality of time-domain signals.

10. The method according to claim 9, wherein when the first plurality of output signals do not include the maximum output signal satisfying the check condition, the method further comprises:
receiving a second plurality of time-domain signals by the receiving circuit;
performing the $J^{th}$ power operation according to the second plurality of time-domain signals to respectively generate a second plurality of computed signals by the computing circuit;
transforming the second plurality of computed signals to a second plurality of frequency-domain signals according to the time-frequency transformation by the transforming circuit;
performing the absolute value operation on the second plurality of frequency-domain signals to generate a second plurality of output signals by the control circuit; and
correspondingly adding the first plurality of output signals and the second plurality of output signals to generate a plurality of auxiliary signals, and selecting the maximum output signal satisfying the check condition from the plurality of auxiliary signals by the selecting circuit.

11. The method according to claim 9, further comprising:
sequentially selecting the maximum output signal from a plurality of sets of output signals of the first plurality of output signals using a window according to a sliding window method, and checking whether the maximum output signal satisfies the check condition by the selecting circuit.

12. The method according to claim 11, wherein one set of output signals of the plurality of sets of output signals satisfies the check condition according to an equation:

$$f(\{Z_k\}_{k=1, k \neq sub\_max}^{M}) + Z_{sub\_max} < G * Z_{sub\_max};$$

where $\{Z_k\}_{k=1}^{M}$ is the set of output signals, M is a size of the window, f(•) is a function, sub_max is an index of a maximum output signal of the set of output signals, and G is a positive real number.

13. The method according to claim 12, wherein the function is an equation:

$$f(\{Z_k\}_{k=1, k \neq sub\_max}^{M}) = \Sigma_{k=1, k \neq sub\_max}^{M} Z_k.$$

14. The method according to claim 9, wherein the time-frequency transformation comprises a fast Fourier transform (FFT).

15. The method according to claim 9, wherein the $J^{th}$ power operation is a $4^{th}$ power operation.

16. The method according to claim 9, wherein the maximum output signal has a maximum amplitude satisfying the check condition.

* * * * *